(12) United States Patent
Hu et al.

(10) Patent No.: US 8,867,303 B2
(45) Date of Patent: Oct. 21, 2014

(54) MEMORY ARBITRATION CIRCUITRY

(75) Inventors: Ray Ruey-Hsien Hu, Milpitas, CA (US); Haiming Yu, Pleasanton, CA (US); Hao-Yuan Howard Chou, San Jose, CA (US)

(73) Assignee: Altera Corporation, San Jose, CA (US)

( * ) Notice: Subject to any disclaimer, the term of this patent is extended or adjusted under 35 U.S.C. 154(b) by 487 days.

(21) Appl. No.: 13/234,925

(22) Filed: Sep. 16, 2011

(65) Prior Publication Data

US 2013/0073763 A1    Mar. 21, 2013

(51) Int. Cl.
*G11C 8/00* (2006.01)
*G11C 7/10* (2006.01)

(52) U.S. Cl.
CPC .................... *G11C 7/1075* (2013.01)
USPC ............. 365/233.1; 365/233.11; 365/233.12; 365/189.04

(58) Field of Classification Search
USPC .................. 365/154, 189.04, 189.14, 189.08, 365/230.08, 230.03, 230.05, 189.011, 129, 365/233.1, 233.11, 233.12, 233.13
See application file for complete search history.

(56) References Cited

U.S. PATENT DOCUMENTS

| | | | |
|---|---|---|---|
| 4,796,232 A | 1/1989 | House | |
| 4,937,781 A | 6/1990 | Lee et al. | |
| 5,001,671 A * | 3/1991 | Koo et al. | 365/230.05 |
| 5,047,921 A | 9/1991 | Kinter et al. | |
| 5,384,737 A * | 1/1995 | Childs et al. | 365/189.05 |
| 5,398,211 A | 3/1995 | Willenz et al. | |
| 5,768,211 A | 6/1998 | Jones et al. | |
| 5,781,480 A * | 7/1998 | Nogle et al. | 365/189.04 |
| 5,973,985 A | 10/1999 | Ferrant | |
| 6,078,527 A * | 6/2000 | Roth et al. | 365/189.04 |
| 6,118,689 A | 9/2000 | Kuo et al. | |
| 6,388,939 B1 | 5/2002 | Manapat et al. | |
| 6,606,275 B2 | 8/2003 | Shau | |
| 6,751,151 B2 | 6/2004 | Hsu et al. | |
| 6,816,955 B1 | 11/2004 | Raza et al. | |
| 7,116,605 B2 | 10/2006 | Hong | |
| 7,349,285 B2 * | 3/2008 | Balasubramanian et al. | 365/230.05 |
| 7,447,059 B2 | 11/2008 | Uematsu | |
| 2006/0203597 A1 | 9/2006 | Izumino | |
| 2008/0037357 A1 | 2/2008 | Pelley, III | |

OTHER PUBLICATIONS

Lewis, U.S. Appl. No. 13/284,721, filed Oct. 28, 2011.

* cited by examiner

*Primary Examiner* — Son Dinh
*Assistant Examiner* — Uyen B Tran
(74) *Attorney, Agent, or Firm* — Treyz Law Group; Jason Tsai

(57) ABSTRACT

An integrated circuit with memory elements is provided. The memory elements may be single-port memory cells that are used to provide multiport memory functionality. The integrated circuit may include an arbitration circuit operable to receive memory access requests from at least first and second request generators. The arbitration circuit may be configured to operate in a synchronous mode and an asynchronous mode. The arbitration circuit operating in the synchronous mode may perform port selection based on a predetermined logic table. The arbitration circuit operating in the asynchronous mode may execute a memory request as soon as it is received by the arbitration circuit. Requests received while a current memory access is being performed may be put on hold until the current memory access has been completed.

21 Claims, 9 Drawing Sheets

| PORT A | PORT B | PORT SELECT |
|---|---|---|
| — | R | B |
| — | W | B |
| R | — | A |
| W | — | A |
| W | R | B |
| R | W | A |
| W | W | B |
| R | R | B |

120: rows 1-4
122: rows 5-6
124: rows 7-8

FIG. 4

MEMORY ARBITRATION CIRCUITRY

BACKGROUND

Integrated circuits such as programmable integrated circuits may contain volatile memory elements in the form of static random access memory (SRAM) cells. Volatile memory elements such as SRAM cells are typically based on cross-coupled inverters (i.e., latches). The memory elements are often arranged in arrays. In a typical array, data lines are used to write data into and read data from the memory elements. Address lines may be used to select which of the memory elements are being accessed.

Certain applications require the memory elements to have dual-port capabilities (i.e., memory elements that include two ports each of which is used to perform a read/write operation). To support dual-port operations, memory elements are typically formed in an eight-transistor configuration. A dual-port memory element includes two cross-coupled inverters. A first pair of access transistors is coupled to the cross-coupled inverters to serve as a first read/write port, whereas a second pair of access transistors is coupled to the cross-coupled inverters to serve as a second read/write port. A conventional eight-transistor (8 T) dual-port memory cell arranged in this way, however, occupies more than double the area of a conventional six-transistor (6 T) single-port memory cell.

In an effort to reduce area of dual-port memory circuitry, techniques have been developed that allow for using 6 T memory elements to provide synchronous dual-port functionality (i.e., both ports are controlled using a single clock). For example, double-clocking techniques involve accessing the memory element during a high clock phase (to fulfill requests associated with a first port) and during a low clock phase (to fulfill requests associated with a second port). Double-clocking memory access, however, limits memory performance and cannot be used to support asynchronous dual-port operation (i.e., operation that involves using two separate clock signals with different clock frequency and/or phase to control the two ports).

SUMMARY

Integrated circuits with memory element circuitry are provided. The memory elements may include single-port memory elements arranged in an array. The memory elements may be configured to interface with peripheral memory control circuitry that provides multiport memory functionality.

For example, the memory circuitry may include a control circuit that directs row addressing circuitry and column driver/sensing circuitry to perform read and write accesses at specific locations in the memory array. The memory circuitry may also include data register and logic circuitry configured to generate memory access requests from at least first and second processing circuits via first and second ports, respectively. The memory circuitry may include a first request generator operable to receive the memory requests associated with the first port, and a second request generator operable to receive the memory requests associated with the second port. Each of the first and second request generators may include a storage circuit that latches high when a pending request is present and that latches low when there are no pending requests.

The memory circuitry may also include an arbitration circuit coupled between the first and second request generators and the control circuit. The arbitration circuit may be configured to receive memory access requests from the first and second request generators and to handle the order in which the memory access requests associated with the first and second ports are executed.

In one suitable embodiment of the present invention, the arbitration circuit may be operable in a synchronous mode (i.e., a mode in which the requests from the first and second ports are controlled using a single clock). If only one memory request is being received at a first of the two ports during a given clock cycle, then the one memory request associated with the first port may be executed. If different types of memory requests are simultaneously received at the first and second ports (i.e., if one port receives a read and the other port receives a write), respectively, the arbitration circuit may be configured to provide read priority (i.e., the arbitration circuit may execute the read operation first) or write priority (i.e., the arbitration circuit may execute the write operation first). If the same type of memory requests are simultaneously receive at the first and second ports (i.e., if both ports receive a read or if both ports receive write), the arbitration circuit may be configured to provided first port priority (i.e., the arbitration circuit may execute the operation associated with the first port first) or second port priority (i.e., the arbitration circuit may execute the operation associated with the second port first).

In another suitable embodiment of the present invention, the arbitration circuit may be operable in an asynchronous mode (i.e., a mode in which the requests from the first and second ports are controlled using first and second clock signals having different frequencies and/or phases). In the asynchronous mode, the arbitration circuit will execute a memory access request as soon as it is received. For example, if the arbitration circuit detects a given memory request at the first port, the arbitration circuit will direct the control circuit to execute the given memory request. If a second memory request is received at the second port before the given memory has been fulfilled, the second memory request will be put on hold until the given memory request has been completed. The arbitration circuit will direct the control circuit to execute the second memory request when it detects that the given memory request has been fulfilled.

Further features of the present invention, its nature and various advantages will be more apparent from the accompanying drawings and the following detailed description.

BRIEF DESCRIPTION OF THE DRAWINGS

FIG. 4 is a table for determining which port to select during synchronous dual-port memory operation in accordance with an embodiment of the present invention.

DETAILED DESCRIPTION

Embodiments of the present invention relate to static random-access memory circuitry. The memory circuitry of the present invention may be used in any suitable integrated circuit. For example, the memory circuitry may be used in an integrated circuit memory device or an application specific integrated circuit (ASIC).

Figure 1:
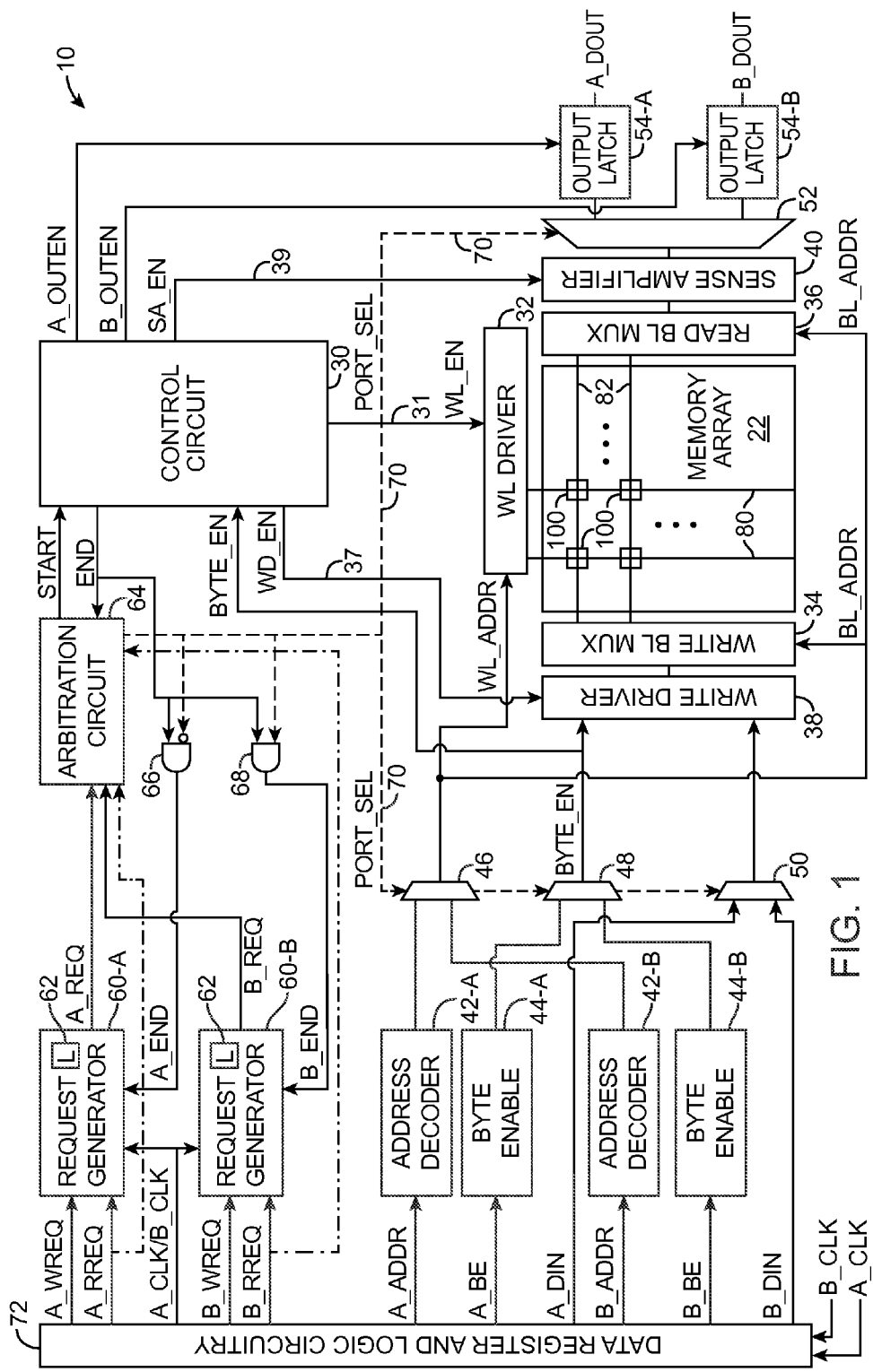
FIG. 1 is a diagram of multiport memory circuitry with an arbitration circuit in accordance with an embodiment of the present invention.

FIG. 1 is a diagram of an integrated circuit 10 that includes memory circuitry having an arbitration circuit configured to support synchronous and asynchronous multiport memory operation. The memory circuitry may contain at least one memory array 22. As shown in FIG. 1, memory array 22 may include memory elements (sometimes referred to as memory cells) 100 arranged in rows and columns. Memory cells 100 may include single-port memory cells. For example, memory cell 100 may be a single-port differential memory cell having six transistors (e.g., a memory cell having a pair of access transistors that serve as a single port for the memory cell). Using single-port memory cells to provide dual-port memory functionality may help increase die yield, provide reduced minimum required power supply voltage (i.e., reduced power consumption), and conserve integrated circuit real estate.

Each row of memory cells 100 may be coupled to word line (WL) driver circuitry 32 via an associated word line 80. For example, a first row of memory cells 100 may be coupled to WL driver circuitry 32 via a first word line 80, a second row of memory cells 100 may be coupled to WL driver circuitry 32 via a second word line 80, etc. WL driver circuitry 32 may be used to assert a word line signal on a selected one of word lines 80 to select a row of memory cells 100. The word line signal and word lines 80 are sometimes referred to as an address signal and address lines, respectively.

Each column of memory cells 100 may be coupled to multiplexing (MUX) circuits such as write bit line multiplexing circuitry 34 and read bit line multiplexing circuitry 36 via associated bit lines (BL) 82. Bit lines 82 may sometimes be referred to as data lines. For example, a first column of memory cells 100 may be coupled to circuitry 34 and 36 via a first pair of bit lines, a second column of memory cells 100 may be coupled to circuitry 34 and 36 via a second pair of bit lines, etc. Bit lines 82 may be supplied with appropriate voltages to read data from or write data into selected memory cells 100. The terms rows and columns described herein are merely illustrative and may be used interchangeably or may be used to refer to any group/collection of memory cells.

Write BL multiplexing circuitry 34 may be configured to select a subset of bit lines 82 to be driven by write driver circuitry 38 (e.g., circuitry 34 may be configured to couple a selected portion of the data lines to write driver circuitry 38). For example, consider a scenario in which memory array 22 includes 128 columns of memory cells 100 and write driver circuitry 38 only includes 32 differential write drivers. In this example, write BL multiplexing circuitry 34 may include 4:1 multiplexing circuits that are used to couple a selected pair of bit lines in a group of four pairs of bit lines to a corresponding write driver in circuitry 38 (i.e., multiplexing circuitry 34 may be used to couple every fourth pair of bit lines to a corresponding write driver during write operations).

Read BL multiplexing circuitry 36 may be configured to couple a subset of bit lines 82 to sense amplifier circuitry 40 (e.g., circuitry 36 may be configured to couple a selected portion of the data lines to sense amplifier circuitry 38). For example, consider the scenario in which memory array 22 includes 128 columns of memory cells 100 and sense amplifier circuitry 40 only includes 32 differential sense amplifiers. In this example, read BL multiplexing circuit 36 may include 4:1 multiplexing circuits that are used to couple a selected pair of bit lines in each group of four pairs of bit lines to a corresponding sense amplifier in circuitry 40 (i.e., multiplexing circuitry 36 may be used to couple every fourth pair of bit lines to a corresponding sense amplifier during read operations). In general, the complexity of multiplexing circuitry 34 and 36 (i.e., whether circuitry 34 and 36 provide 2:1 multiplexing, 4:1 multiplexing, 8:1 multiplexing, etc.) may depend on the number of memory columns present in memory array 22 and the number of available write drivers and sense amplifiers for driving signals onto and receiving signals from bit line pairs 82.

The 6 T single-port memory cells 100 in array 22 may provide dual-port functionality through the use of peripheral memory circuitry. For example, word line driver circuitry 32 may receive row address signals WL_ADDR from one of first address decoder 42-A and second address decoder 42-B through multiplexer 46. Multiplexer 46 may have a first input that is coupled to address decoder 42-A, a second input that is coupled to address decoder 42-B, and an output that is coupled to word line driver circuitry 32. Bit line multiplexing circuitry 34 and 36 may also receive column address signals BL_ADDR from one of address decoders 42-A and 42-B via multiplexer 46.

Address decoder 42-A may receive address signals A_ADDR (i.e., row and column address signals associated with a first memory port), whereas address decoder 42-B may receive address signals B_ADDR (i.e., row and column address signals associated a second memory port). Multiplexer 46 may be used to selectively route one of signals A_ADDR and B_ADDR to its output (i.e., so that word line driver 32 receives row signals WL_ADDR from a selected one of the two memory ports and so that multiplexing circuitry 34 and 36 receive column signals BL_ADDR from the selected memory port).

Write driver circuitry 38 may be controlled by a byte enable signal BYTE_EN generated at an output of multiplexer 48. Multiplexer 48 may have a first input that is coupled to first byte enable circuit 44-A and a second input that is coupled to second byte enable circuit 44-B. Byte enable circuit 44-A may receive enable signals A_BE associated with a first memory port, whereas byte enable circuit 44-B may receive enable signals B_BE associated with a second memory port. Multiplexer 48 may be used to selectively route one of enable signals A_BE and B_BE to its output.

Signal BYTE_EN may be used to turn on a selected portion of write driver circuitry 38. For example, consider a scenario in which write driver circuitry 38 includes 32 write drivers. Signal BYTE_EN may be used to turn on only eight of the 32 write drivers and to disable the remaining 24 write drivers so that only eight columns are being simultaneously loaded (i.e., only one byte of data is written at a time). If desired, signal BYTE_EN may be used to select any suitable subset of write driver circuitry 38.

Write driver circuitry 38 and WL driver circuitry 32 may be controlled by a control circuit such as control circuitry 30. For example, control circuit 30 may provide word line enable signal WL_EN over path 31 to WL driver circuit 32 to turn on circuitry 32 during read/write operations. Control circuit 30 may also provide write enable signal WD_EN over path 37 to turn on write driver circuitry 38 during write operations and read enable signal SA_EN over path 39 to turn on sense amplifier circuitry 40 during read operations.

Sense amplifier circuitry 40 may be coupled to first output latch 54-A associated with the first memory port and second output latch 54-B associated with the second memory port through multiplexer 52. Multiplexer 52 may be configured to route read signals to a selected one of the two output latches 54-A and 54-B. Output latch 54-A may also receive enable signal A_OUTEN that enables latch 54-A to selectively capture eight bits out of the 32 output data signals from sense amplifier circuitry 40 during readout for the first port (as an example). Similarly, output latch 54-B may receive signal B_OUTEN that enables latch 54-B to selectively capture a subset of total output data bits from sense amplifier circuitry 40 during readout for the second port. Signals A_OUTEN and B_OUTEN may enable the same bits corresponding to the columns enabled by signal BTYE_EN. In general, output latches 54-A and 54-B may be configured to capture any desired portion of output bits from sense amplifier circuitry 40.

Write driver circuitry 38 may receive write data from an output of multiplexer 50. Multiplexer 50 may have a first input that receives write data A_DIN associated with the first memory port and a second input that receives write data B_DIN associated with the second memory port. Multiplexer 50 may be configured to route one of signals A_DIN and B_DIN to the inputs of the write driver circuits.

As shown in FIG. 1, address signals A_ADDR and B_ADDR, enable signals A_BE and B_BE, input data signals A_DIN and B_DIN, and other control signals may be provided using data register and logic circuitry 72. Circuitry 72 may receive first clock signal A_CLK associated with the first memory port and a second clock signal B_CLK associated with the second memory port. The memory circuitry appears as a dual-port memory from the reference point of data register and logic circuitry 72, because the memory circuitry is capable to handing read and write request from first and second ports each of which is control using different clock signals A_CLK and/or B_CLK.

Circuitry 72 may have a first pair of outputs at which first write request signals A_WREQ and first read request signals A_RREQ associated with the first port are generated and a second pair of outputs at which second write request signals B_WREQ and second read request signals B_RREQ associated with the second port are generated. Signals A_WREQ and A_RREQ may be received using a first request generator 60-A, whereas signals B_WREQ and B_RREQ may be received using a second request generator 60-B. The first and second request generators may each contain a latching circuit 62 that latches high in the presence of a pending unfulfilled request and that latches low in the absence of memory requests.

The request generators may be configured to generate a pulse at its output in response to receiving a read or write request. For example, if request generator 60-A receives a write request, signal A_REQ will be pulsed high for a predetermined time period. As another example, if request generator 60-B receives a read request, signal B_REQ will be pulsed high for the predetermined time period.

Signals A_REQ and B_REQ may be received using an arbitration circuit such as arbitration circuit 64. Arbitration circuit 64 may also receive read request signals A_RREQ and B_RREQ directly from data register and logic circuitry 72 (as indicated by the dotted lines). Arbitration circuit 64 may serve to determine the order in which to process the requests from the first and second ports. Arbitration circuit 64 may output a port select signal PORT_SEL over output path 70. Signal PORT_SEL may be fed to control inputs of multiplexers 46, 48, 50, and 52 over path 70 to route circuitry associated with the selected port to memory array 22. For example, a low PORT_SEL may indicate that a request from the first port is currently being selected for processing, whereas a high PORT_SEL may indicated that a request from the second port is currently being selected for processing. When arbitration circuit 64 decides to execute a request, circuit 64 will temporarily assert output signal START to direct control circuit 30 to initiate the desired read/write operation.

When a current memory request has been fulfilled (i.e., upon completion of a read/write operation into memory array 22 at the desired memory location), arbitration circuit 64 may receive an asserted signal END from control circuit 30. Signal END may be coupled back to request generator 60-A through logic AND gate 66 and may be coupled back to request generator 60-B through logic AND gate 68. In particular, logic AND gate 66 may have a first input that receives signal END, a second inverting input that receives signal PORT_SEL, and an output coupled to generator 60-A on which signal A_END is provided. Logic AND gate 68 may have first input that receives signal END and a second input that receives signal PORT_SEL, and an output coupled to generator 60-B on which signal B_END is provided. Latch 62 in request generator 60-A may be cleared in response to receiving a high A_END, whereas latch 62 in request generator 60-B may be cleared in response to receiving a high B_END.

The memory architecture described in connection with FIG. 1 is merely illustrate and is not intended to limit the scope of the present invention. If desired, arbitration circuit 64 may be configured to handle memory requests from any desired number of ports to support tri-port memory mode, quad-port memory mode, etc.

Figure 2:
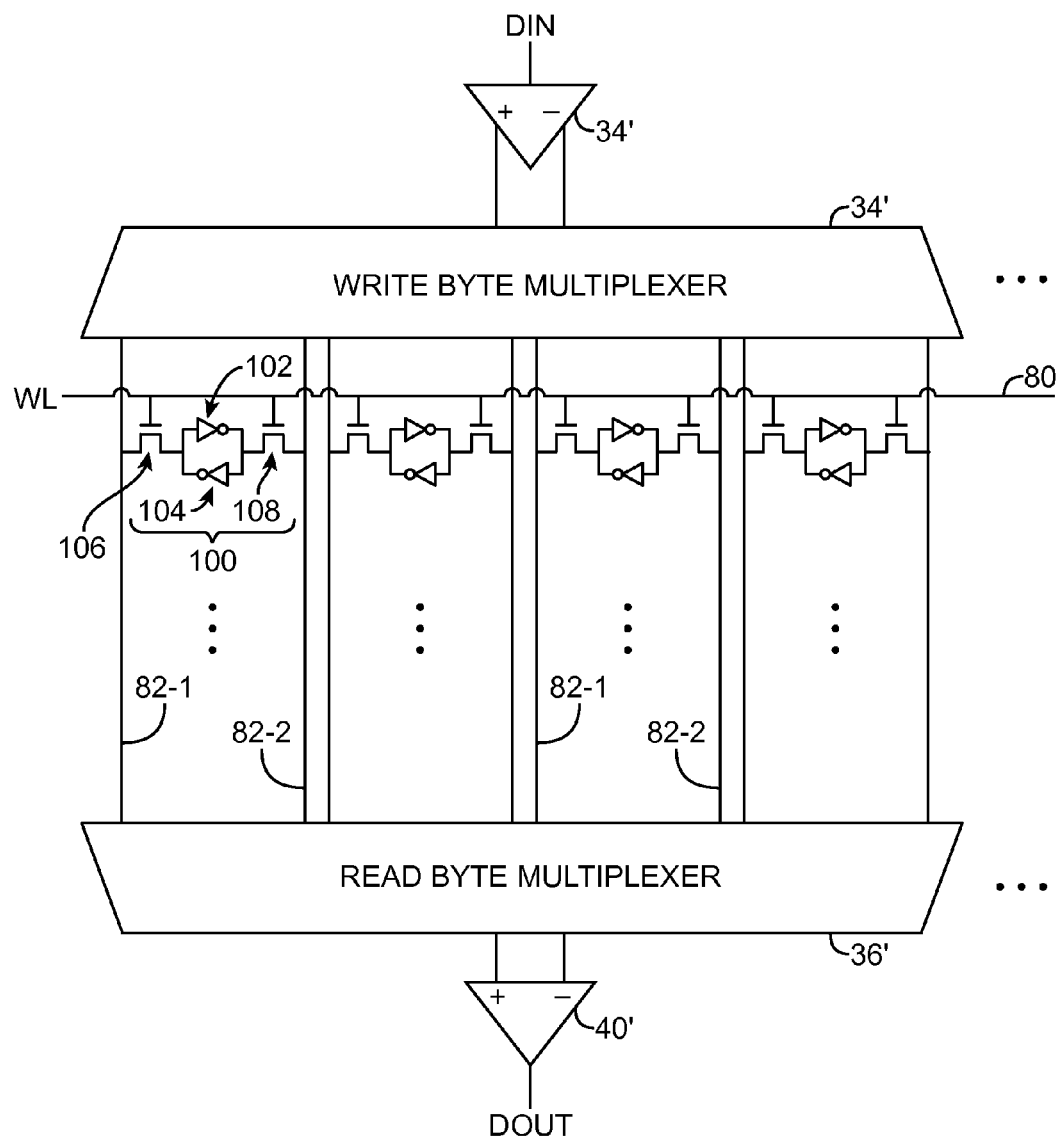
FIG. 2 is a diagram of memory element circuitry coupled to associated column multiplexing circuits in accordance with an embodiment of the present invention.

FIG. 2 is a diagram illustrating 4:1 column multiplexing (i.e., one in four columns is driven by a shared differential write driver 34' during a write, whereas one in four columns is coupled to a shared differential sense amplifier 40' during a read. As shown in FIG. 2, each column may include multiple memory cells coupled to a pair of bit lines 82-1 and 82-2. For example, memory cell 100 may include a bistable element formed from a pair of cross-coupled inverters 102 and 104. Inverter 104 may have an output serving as a first data storage node for cell 100, whereas inverter 102 may have an output serving as a second data storage node for cell 100. A first access transistor 106 may be coupled between the first data storage node and first bit line 82-1, whereas a second access transistor 108 may be coupled between the second data storage node and second bit line 82-2. Access transistors 106 and 108 (sometimes referred to as address transistors) may be controlled by word line signal WL provided over word line 80. In this example, signal WL may be asserted to select a row of memory cells 100, and one out of every four adjacent cells may be coupled to the associated write driver 34' during data loading operations or to the associated sense amplifier 40' during data sensing operations.

The memory cell of FIG. 2 is merely illustrative and is not intended to limit the scope of the present invention. If desired, memory cell 10 may be a single-ended single-port memory cell, may include more than two cross-coupled inverting circuits, or may be implemented using any suitable single-port memory configuration.

Figure 3:
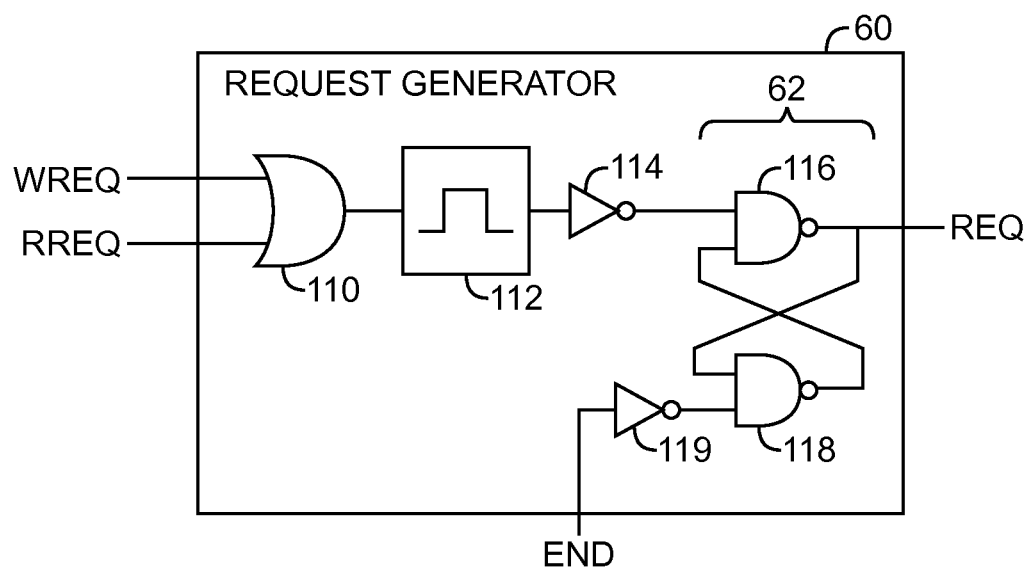
FIG. 3 is a circuit diagram of an illustrative request generator in accordance with an embodiment of the present invention.

FIG. 3 is a circuit diagram of request generator (i.e., request generator 60-A or 60-B). As shown in FIG. 3, request generator 60 may have a first input at which write request signal WREQ can be received, a second input at which read request signal RREQ can be received, and a third input at which signal END can be received. Request generator 60 may include a logic OR gate 110 having first and second inputs serving as the first and second inputs for generator 60 (i.e., the first input of generator 110 may receive WREQ, whereas the second input of generator 110 may receive RREQ). Logic gate 110 may have an output that is coupled to a one-shot pulse generator 112. One-shot pulse generator 112 may be configured to generate a pulse having a given pulse width in response to detecting a rising edge in signals WREQ and/or RREQ.

The pulse produced by generator 112 may be fed to a first input of latching circuit 62 through inverter 114. Circuit 62 may be a set-reset (SR) latch containing cross-coupled logic NAND gates 116 and 118 (as an example). The given pulse width may be wide enough to provide sufficient time to set or reset the state of latch 62. Latching circuit 62 may have a second input configured to receive signal END through inverter 119 and an output on which signal REQ is provided. Signal REQ may be raised high (i.e., latch 62 will be placed in a high state) in response to detecting a rising edge in signals WREQ and/or RREQ, because one-shot pulse generator 112 is coupled to the "set" input of SR latch 62. Latch 62 may be placed in a low state (i.e., signal REQ will be driven low) in response to detecting an asserted signal END, because signal END is routed to the "reset" input of SR latch 62.

Arbitration circuit 64 may be operable in a synchronous mode or an asynchronous mode. In the synchronous mode, the requests from the multiple ports may be controlled using a single clock source. As a result, memory access requests from the multiple ports may arrive simultaneously at a rising edge of the single clock signal. Synchronous mode arbitration circuit 64 may, for example, determine which one of the multiple ports is to be selected based on the table of FIG. 4.

In the scenario in which there is a pending request at only one of the two ports, the port associated with the pending request may be selected for processing (see, e.g., rows 120). In the scenario in which one port receives a write request and the other port receives a read request, the port that receives the read request may be selected for processing (i.e., arbitration circuit 64 may be configured to implement read port priority, as indicated by rows 122). If desired, arbitration circuit 64 may also be configured to implement write port priority (i.e., the port that receives the write request may be selected for processing). In the scenario in which both ports receive write requests or both ports receive read requests, the second port B may be given priority (i.e., the request at port B will be processed before the request at port A), as illustrated in rows 124. If desired, arbitration circuitry 64 may also be configured to implement port A priority when both ports received the same type of memory requests (i.e., the request at port A will be processed before the request at port B when ports A and B both receive a read request or when ports A and B both receive a write request).

Figure 5:
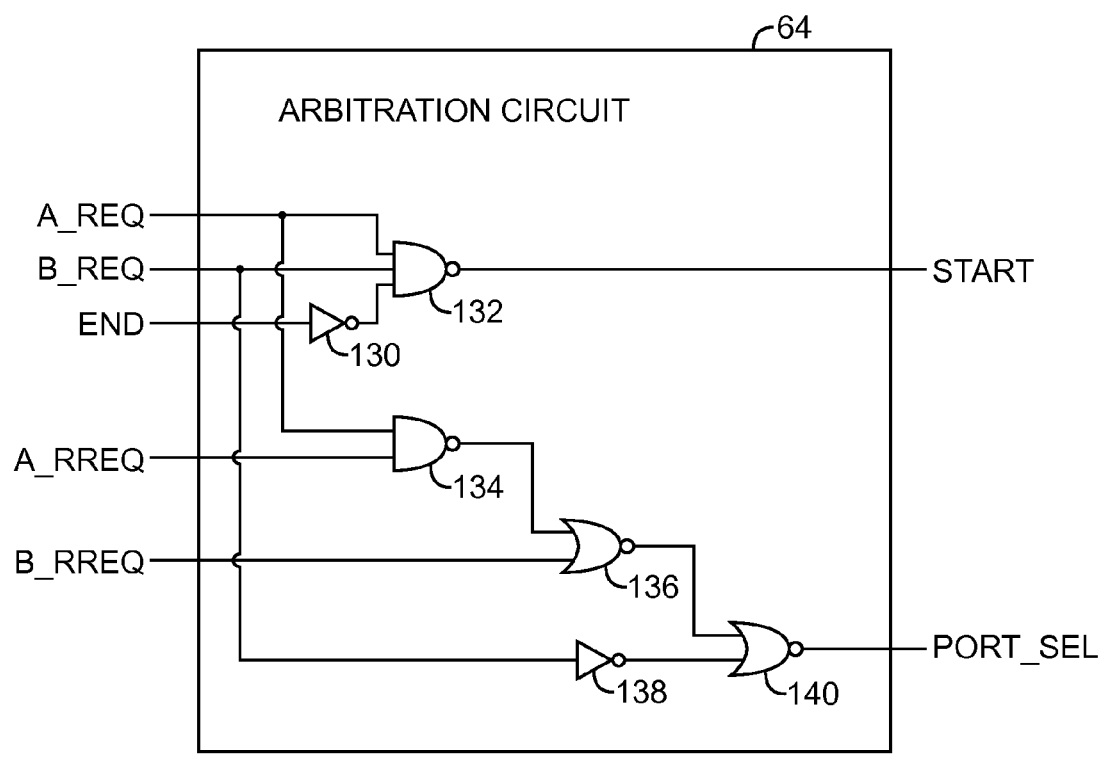
FIG. 5 is a circuit diagram of an illustrative arbitration circuit operable to support synchronous dual-port memory operation in accordance with an embodiment of the present invention.

FIG. 5 is a circuit diagram of arbitration circuit 64 configured to provide port selection capabilities described in connection with the table of FIG. 4. As shown in FIG. 5, arbitration circuit 64 may include logic NAND gates 132 and 134 and logic NOR gates 136 and 140. Logic NAND gate 132 may have a first input that receives signal A_REQ from request generator 60-A, a second input that receives signal B_REQ from request generator 60-B, a third input that receives signal END from control circuit 30 through inverter 130, and an output on which signal START is generated. Logic NAND gate 134 may have a first input that receives signal A_REQ, a second input that receives signal A_RREQ from data register and logic circuitry 72, and an output. Logic NOR gate 136 may have a first input that is coupled to the output of gate 134, a second input that receives signal B_RREQ from data register and logic circuitry 72, and an output. Logic NOR gate 140 may have a first input that is coupled to the output of gate 136, a second input that receives signal B_REQ from request generator 60-B through inverter 138, and an output on which signal PORT_SEL is generated. The exemplary circuit diagram of FIG. 5 is merely illustrative and does not serve to limit of the scope of the present invention. Arbitration circuit 64 may be formed using any suitable arrangement configured to provide the desired port selectability.

Figure 6:
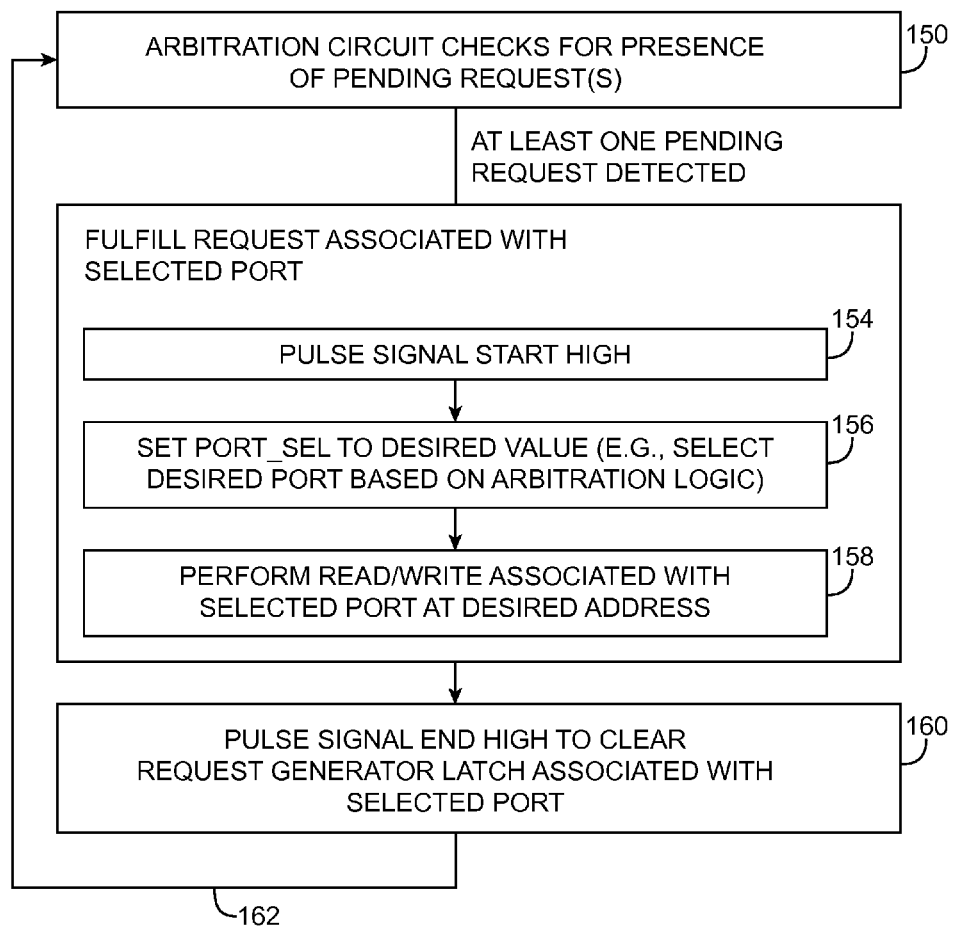
FIG. 6 is a flow chart of illustrative steps for processing pending memory access requests in synchronous dual-port mode in accordance with an embodiment of the present invention.

FIG. 6 is a flow chart of illustrative steps involved in operating the memory circuitry in synchronous mode. At step 150, arbitration circuit 64 may check for the presence of pending requests. If at least one pending request is detected, the request associated with the selected port will be fulfilled (i.e., the request associated with the port selected based on a logic table of the type described in connection with FIG. 4).

In fulfilling the selected request, arbitration circuit 64 may assert signal START to direct control circuit 30 to initiate access of memory array 22 (step 154). At step 156, signal PORT_SEL may be set to the desired value based on the logic of arbitration circuit 64. At step 158, a read or write operation associated with the selected port may be performed at the desired memory address.

Upon completion of the memory access, control circuit 30 may pulse signal END high to clear the request generator associated with the selected port to signal the completion of the current request (step 160). Processing may loop back to step 150 to processing a successive request, as indicated by path 162. At this time, a previously pending request associated with the unselected port (i.e., a request received in parallel with the request associated with the selected port), if present, may be processed before processing another request from the selected port. If no pending request is present, arbitration circuit 64 will wait and monitor its inputs for newly arriving memory requests (step 150).

In another embodiment of the present invention, arbitration circuit 64 may be configured to operate in asynchronous mode (e.g., a mode in which requests from multiple ports are controlled using clocks of different phases and/or frequencies). In asynchronous dual-port operation, requests from different memory ports often arrive at different times. As a result, arbitration circuit 64 may be configured to process a first arriving memory request as soon as it is received by circuit 64 and to process a second (later) arriving memory request when the first arrive memory request has been fulfilled.

Figure 7:
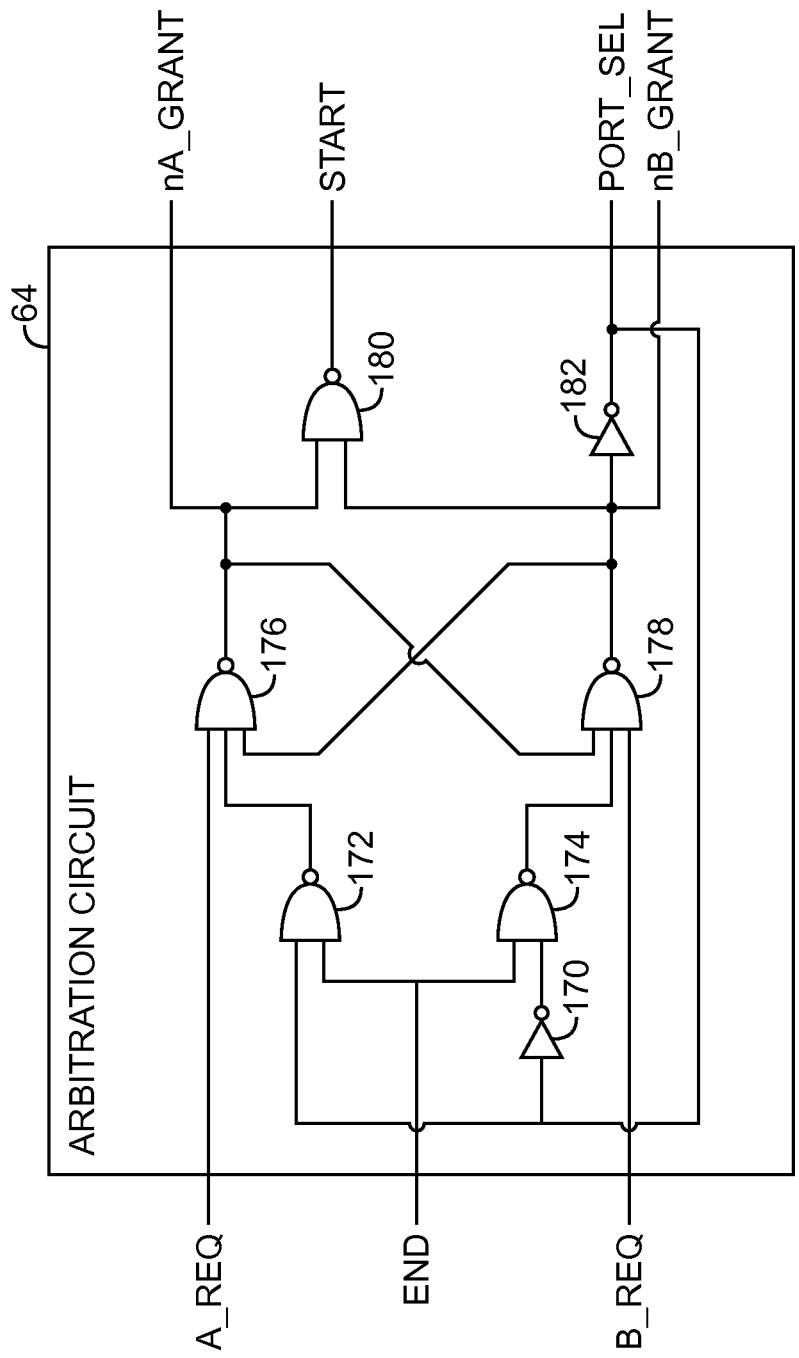
FIG. 7 is a circuit diagram of an illustrative arbitration circuit operable to support asynchronous dual-port memory operation in accordance with an embodiment of the present invention.

FIG. 7 is an exemplary circuit diagram of one suitable arrangement of arbitration circuit 64 operable in asynchronous mode. As shown in FIG. 7, arbitration circuit 64 my include logic NAND gates 172, 174, 176, 178, and 180 each having multiple inputs and an output. Logic NAND gate 176 may have a first input that receives signal A_REQ from request generator 60-A, a second input that is coupled to the output of gate 172, a third input that is coupled to the output of gate 178, and may generate signal nA_GRANT at its output. Logic NAND gate 178 may have a first input that receives signal B_REQ from request generator 60-B, a second input that is coupled to the output of gate 174, a third input that is coupled to the output of gate 176, and may generate signal nB_GRANT at its output. Signal nA_GRANT may be driven low when the request from generator 60-A is selected, whereas signal nB_GRANT may be driven low when the request from generator 60-B is selected.

Arbitration circuit 64 may also include an inverter 182 having an input coupled to the output of gate 178 and an output on which signal PORT_SEL is provided. Logic NAND gate 180 may have a first input coupled to the output of gate 176, a second input coupled to the output of gate 178, and may generate signal START at its output. Logic NAND gate 172 may have a first input coupled to the output of inverter 182 and a second input that receives signal END from control circuit 30, whereas logic NAND gate 174 may have a first input that is coupled to the output of inverter 182 through another inverter 170 and a second input that receives signal END.

NAND gates 176 and 178 cross-coupled in this way may serve to provide latching and gating capability for arbitration circuit 64. For example, gates 176 and 178 will only assert one of signals nA_GRANT and nB_GRANT and will only toggle PORT_SEL when a rising edge in signal END is detected. The exemplary circuit diagram of FIG. 7 is merely illustrative and does not serve to limit of the scope of the present invention.

Figure 8:
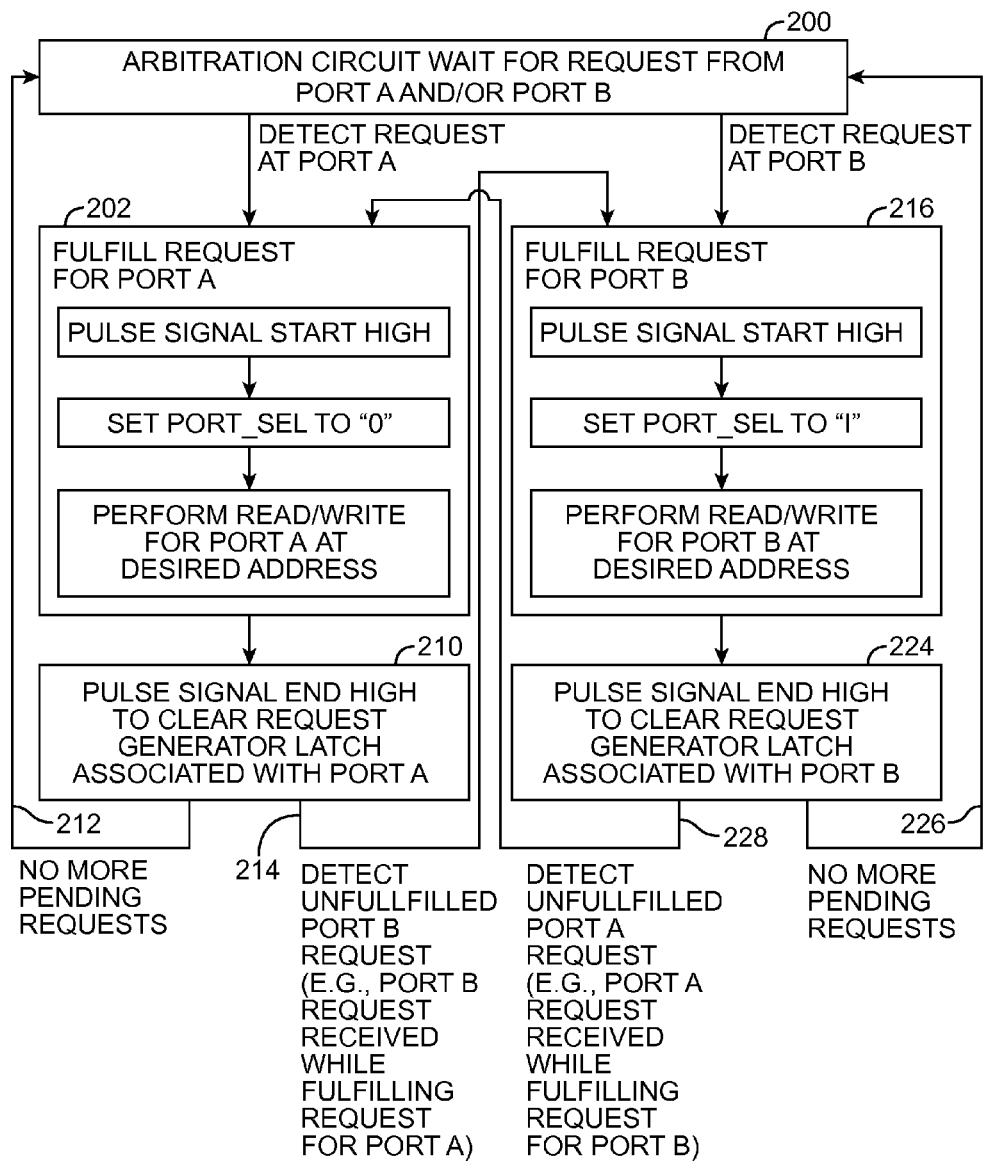
FIG. 8 is a flow chart of illustrative steps for processing pending memory access requests in asynchronous dual-port mode in accordance with an embodiment of the present invention.

FIG. 8 is a flow chart of illustrative steps for operating the memory circuitry of FIG. 1 in asynchronous mode. At step 200, arbitration circuit 64 may wait for requests from request generators 60-A (port A) and 60-B (port B). If a request at port A is detected before detecting a request at port B, the request from port A may be fulfilled (step 202). If a request at port B is detected before detecting a request at port A, the request from port B may be fulfilled (step 216).

At step 202, signal START may be raised high, signal PORT_SEL may be set to "0," and a desired read/write operation may be performed at the specified address location. At step 210, signal END may be pulsed high to clear request generator 60-A and to pull signal START low to signify completion of the current memory access. If there are no pending requests, processing may loop back to step 200, as indicated by path 212. If a pending request at port B is detected (i.e., a pending request that was received while step 202 was being performed), processing may loop to step 216, as indicated by path 214.

At step 216, the request from port B may be fulfilled. For example, signal START may be raised high, signal PORT_SEL may be set to "1," and a desired read/write operation may be performed at the specified address location. At step 224, signal END may be pulsed high to clear request generator 60-B and to pull signal START low to signify completion of the current memory access. If there are no pending requests, processing may loop back to step 200, as indicated by path 226. If a pending request at port A is detected (i.e., a pending request that was received while step 216 was being performed), processing may loop to step 202, as indicated by path 228.

In general, if memory requests from ports A and B are to arrive simultaneously, a random one of the two requests will be selected for processing. Regardless of the order in which the simultaneously arriving memory requests from ports A and B are fulfilled, arbitration circuit 64 will ensure that both memory requested will be executed.

Figure 9:
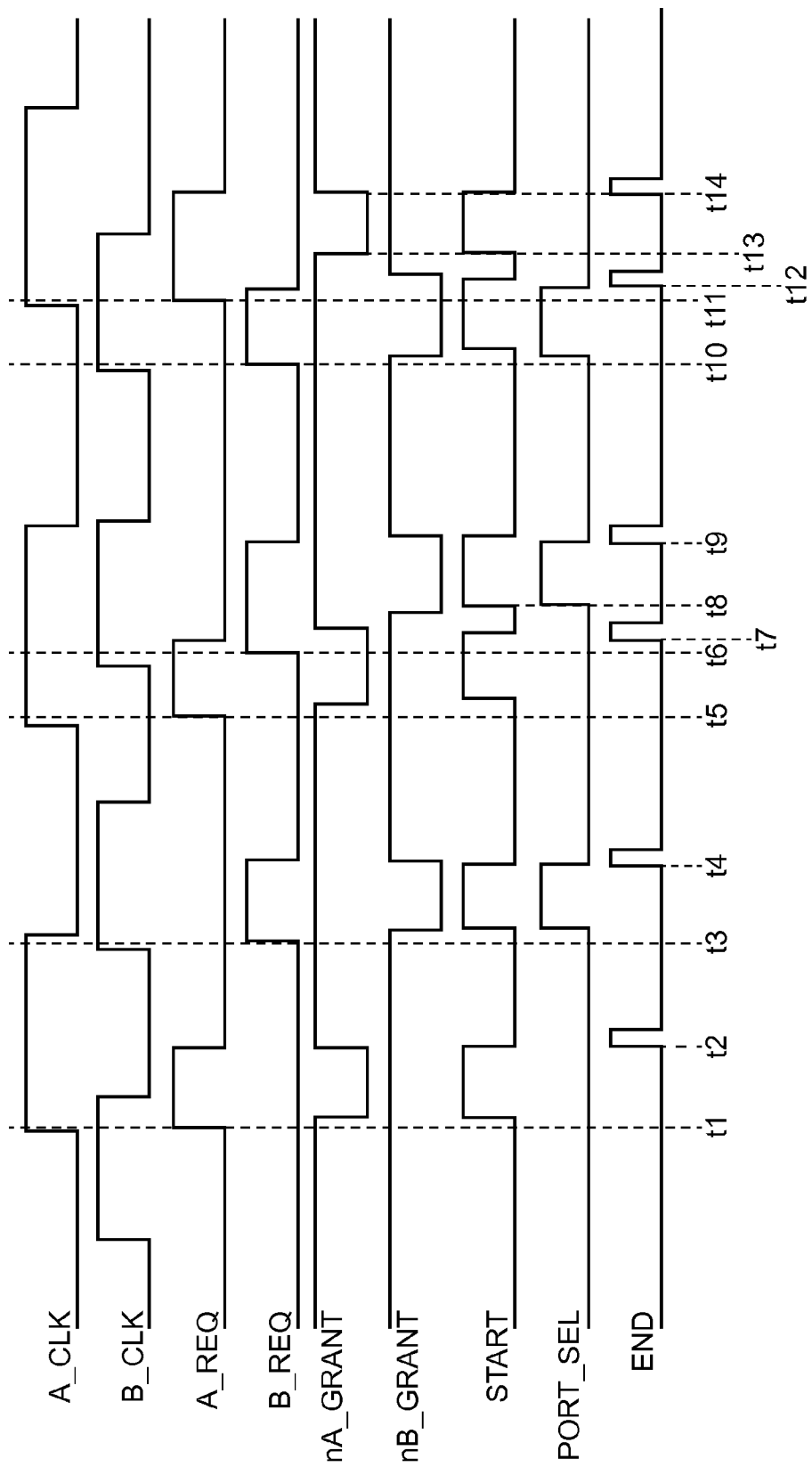
FIG. 9 is a timing diagram illustrating different memory access sequences during asynchronous dual-port mode in accordance with an embodiment of the present invention.

FIG. 9 is a timing diagram showing the operation of arbitration circuit 64 in asynchronous mode. As shown in FIG. 9, port A clock signal A_CLK and port B clock signal B_CLK may have different clock frequencies and phases. At time t1, signal A_REQ is raised high while B_REQ stays low (i.e., a singular request from port A is received). In response to A_REQ rising, signal START may be driven high and signal nA_GRANT may be driven low. At time t2, signal END may be temporarily pulsed high to signify completion of the port A request (to clear latch 62 in generator 60-A), causing A_REQ and START to be driven low and nA_GRANT to be driven high.

At time t3, signal B_REQ is raised high while A_REQ stays low (i.e., a singular request from port B is received). In response to B_REQ rising, signal PORT_SEL may be driven high, signal START may be driven high, and signal nB_GRANT may be driven low. At time t4, signal END may be temporarily pulsed high to signify completion of the port B request (to clear latch 62 in generator 60-B), causing B_REQ, START, and PORT_SEL to be driven low and nB_GRANT to be driven high. Time t1 to t4 therefore shows a scenario in which arbitration circuit 64 receives first and second requests from two different ports, where the second request is received after the first request has been fulfilled.

It is also possible for arbitration circuit 64 to receive a memory request from port B while it is processing a memory request from port A, as illustrated from time t5 to t9. At time t5, signal A_REQ is raised high while B_REQ stays low. In response to A_REQ rising, signal START may be driven high and signal nA_GRANT may be driven low. At time t6, signal B_REQ is raised high while A_REQ is still high (i.e., a request has been received at port B before the access associated with port A has been completed). This change in B_REQ will not affect the control signals (i.e., signals nA_GRANT, nB_GRANT, START, PORT_SEL, and END) because the request from port A has yet to be completed.

Shortly after time t6 (at time t7), signal END may be pulsed high to signify the completion of the port A request, causing signal A_REQ and START to be driven low and nA_GRANT to be driven high. Because B_REQ is still high, arbitration circuit 64 will immediately execute this pending request from port B by driving signal PORT_SEL high, signal START high, and signal nB_GRANT low (at time t8). At time t9, signal END may be temporarily pulsed high to signify completion of the port B request, causing B_REQ, START, and PORT_SEL to be driven low and nB_GRANT to be driven high. Time t5 to t9 therefore shows a scenario in which arbitration circuit 64 receives first and second requests from two different ports, where the second request is received before the first request has been fulfilled.

It is also possible for arbitration circuit 64 to receive a memory request from port A while it is processing a memory request from port B, as illustrated from time t10 to t14. At time t10, signal B_REQ is raised high while A_REQ stays low. In response to B_REQ rising, signal PORT_SEL may be driven high, signal START may be driven high, and signal nB_GRANT may be driven low. At time t11, signal A_REQ is raised high while B_REQ is still high (i.e., a request has been received at port A before the access associated with port B has been completed). This change in A_REQ will not affect control signals nA_GRANT, nB_GRANT, START, PORT_SEL, and END because the request from port B has yet to be completed.

Shortly after time t11 (at time t12), signal END may be pulsed high to signify the completion of the port B request, causing signal B_REQ, START, and PORT_SEL to be driven low and nB_GRANT to be driven high. Because A_REQ is still high, arbitration circuit 64 will immediately execute this pending request from port A by driving signal START high and signal nA_GRANT low (at time t13). At time t14, signal END may be temporarily pulsed high to signify completion of the port A request, causing A_REQ and START to be driven low and nA_GRANT to be driven high.

The dual-port functionality of the memory circuitry described in connection with FIGS. 1-9 is merely illustrative and is not intended to limit the scope of the present invention. Arbitration circuit 64 may be configured to operate in the synchronous mode or the asynchronous mode as desired by the user (e.g., arbitration circuit 64 may switch between the synchronous mode and the asynchronous depending on the current customizable application). If desired, the embodiments described herein may be applied to other types of memory cells and may be configured to support multiport memory operation in synchronous and asynchronous modes.

The foregoing is merely illustrative of the principles of this invention and various modifications can be made by those skilled in the art without departing from the scope and spirit of the invention. The foregoing embodiments may be implemented individually or in any combination.

What is claimed is:

1. A dual-port memory having first and second ports comprising:
   an array of single-port memory elements;
   a control circuit that is coupled to the array and that is operable to read data from and write data into the array;
   a first request generator operable to receive a first memory access request from the first port;
   a second request generator operable to receive a second memory access request from the second port; and
   an arbitration circuit coupled to the control circuit and the first and second request generators, wherein the arbitration circuit is operable in a synchronous mode in which the first and second request generators are controlled using first and second clock signals having equal frequencies and is operable to direct the control circuit to fulfill a single one of the first and second memory access requests during each clock period of the first clock signal and during each clock period of the second clock signal.

2. The dual-port memory defined in claim 1, wherein at least one of the first and second request generators comprises a pulse generator and a latching circuit, wherein the pulse generator is operable to generate a pulse in response to receiving a memory access request, and wherein the latching circuit is operable to store a first logic value when the memory access request has yet to be performed and is operable to store a second logic value that is different than the first logic value when the memory access request has been performed using the control circuit.

3. The dual-port memory defined in claim 1, wherein the arbitration circuit is operable to select the single one of the first and second memory access requests for fulfillment based on a predetermined logic table.

4. The dual-port memory defined in claim 1, wherein the arbitration circuit comprises a logic gate having a first input operable to receive a first output signal from the first request generator, a second input operable to receive a second output signal from the second request generator, a third input operable to receive a control signal from the control circuit, and an output on which an output signal is provided, and wherein the output signal is asserted while the control circuit accesses the array.

5. The dual-port memory defined in claim 1, wherein the arbitration circuit comprises a logic gate having a first input that is coupled to the second request generator, a second input that is coupled to the first and second request generators, and an output on which an output signal is provided, and wherein the output signal has a first logic value when fulfilling the first memory access request and has a second logic value that is different than the first logic value when fulfilling the second memory access request.

6. The dual-port memory defined in claim 1, wherein the arbitration circuit is further operable in an asynchronous mode in which the first and second request generators are controlled using at least two clock signals having different frequencies.

7. The dual-port memory defined in claim 6, wherein at least one of the first and second request generators comprises a pulse generator and a latching circuit, wherein the pulse generator is operable to generate a pulse in response to receiving a memory access request, and wherein the latching circuit is operable to store a first logic value when the memory access request has yet to be performed and is operable to store a second logic value that is different than the first logic value when the memory access request has been performed using the control circuit.

8. The dual port memory defined in claim 6, wherein the arbitration circuit is operable to select a single one of the first and second memory access requests for fulfillment based on a predetermined logic table when operating in the synchronous mode.

9. The dual port memory defined in claim 6, wherein the first and second memory access requests arrive at different times, and wherein the arbitration circuit is operable to select an earlier arriving one of the first and second memory access requests for fulfillment when operating in the asynchronous mode.

10. The dual port memory defined in claim 6, wherein the arbitration circuit is operable to assert an output signal to direct the control circuit to fulfill a selected one of the first and second memory access requests and to deassert the output signal in response to fulfillment of the selected memory access request.

11. A dual-port memory having first and second ports comprising:
    an array of single-port memory elements;
    a control circuit that is coupled to the array and that is operable to read data from and write data into the array;
    a first request generator operable to receive a first memory access request from the first port;
    a second request generator operable to receive a second memory access request from the second port; and
    an arbitration circuit coupled to the control circuit and the first and second request generators, wherein the arbitration circuit is operable in an asynchronous mode in which the first and second request generators are controlled using two different clock signals having different respective frequencies.

12. The dual-port memory defined in claim 11, wherein at least one of the first and second request generators comprises a pulse generator and a latching circuit, wherein the pulse generator is operable to generate a pulse in response to receiving a memory access request, and wherein the latching circuit is operable to store a first logic value when the memory access request has yet to be performed and is operable to store a second logic value that is different than the first logic value when the memory access request has been performed using the control circuit.

13. The dual-port memory defined in claim 11, wherein the two different clock signals controlling the first and second request generators have different respective phases.

14. The dual-port memory defined in claim 11, wherein the first and second memory access requests arrive at different times, and wherein the arbitration circuit is operable to select an earlier arriving one of the first and second memory access requests for fulfillment when operating in the asynchronous mode.

15. The dual-port memory defined in claim 11, wherein the arbitration circuit comprises a latching circuit having first and second cross-coupled logic gates, wherein the first logic gate is operable to receive a first output signal from the first request generator and is operable to generate a first control signal having a first logic value, and wherein the second logic gate is operable to receive a second output signal from the second request generator and is operable to generate a second control signal having a second logic value that is different than the first logic value.

16. A method for using dual-port memory that includes an array of single-port memory elements and first and second ports, the method comprising:
    accessing the array of single-port memory elements using a control circuit;
    receiving a first memory access request from the first port using a first request generator;
    receiving a second memory access request from the second port using a second request generator;
    directing the control circuit to fulfill a selected one of the first and second memory access requests by asserting an output signal using an arbitration circuit;
    asserting a control signal in response to fulfillment of the selected memory access request using the control circuit; and
    receiving the control signal using the first and second request generators.

17. The method defined in claim 16 further comprising:
deasserting the output signal in response to fulfillment of the selected memory access request.

18. The method defined in claim 16 further comprising:
operating the dual-port memory in a synchronous mode in which the first and second request generators are controlled using at least two clock signals having equal frequencies.

19. The method defined in claim 16 further comprising:
operating the dual-port memory in an asynchronous mode in which the first and second request generators are controlled using at least two clock signals having different frequencies.

20. The method defined in claim 16 further comprising:
operating the dual-port memory in a synchronous mode in which the first and second request generators are controlled using at least two clock signals having equal frequencies; and
operating the dual-port memory in an asynchronous mode in which the first and second request generators are controlled using at least two clock signals having different frequencies.

21. The method defined in claim 16 wherein at least one of the first and second request generators comprises a pulse generator and a latching circuit, the method further comprising:
    with the pulse generator, generating a pulse in response to detecting that a memory access request has arrived at the at least one of the first and second request generators;
    with the latching circuit, storing a first logic value when the memory access request has yet to be fulfilled and storing a second logic value that is different than the first logic value when the memory access request has been fulfilled using the control circuit.

* * * * *